(12) United States Patent
Choi et al.

(10) Patent No.: US 9,305,657 B2
(45) Date of Patent: Apr. 5, 2016

(54) NON-VOLATILE MEMORY DEVICE AND RELATED METHOD OF OPERATION

(71) Applicant: SAMSUNG ELECTRONICS CO., LTD., Suwon-Si, Gyeonggi-Do (KR)

(72) Inventors: Myung-Hoon Choi, Suwon-si (KR); Jae-Woo Im, Yongin-si (KR); Ki-Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/522,753

(22) Filed: Oct. 24, 2014

(65) Prior Publication Data

US 2015/0228346 A1   Aug. 13, 2015

(30) Foreign Application Priority Data

Feb. 13, 2014   (KR) ........................ 10-2014-0016742

(51) Int. Cl.
*G11C 16/04* (2006.01)
*G11C 16/26* (2006.01)
*G11C 16/10* (2006.01)
*G11C 16/16* (2006.01)

(52) U.S. Cl.
CPC ............... *G11C 16/26* (2013.01); *G11C 16/10* (2013.01); *G11C 16/16* (2013.01)

(58) Field of Classification Search
CPC .... G11C 11/5628; G11C 16/26; G11C 16/10; G11C 13/0069; G11C 29/028; G11C 2013/0076
See application file for complete search history.

(56) References Cited

U.S. PATENT DOCUMENTS

| | | | |
|---|---|---|---|
| 6,851,018 B2 | 2/2005 | Wyatt et al. | |
| 7,657,696 B2 | 2/2010 | Su et al. | |
| 8,243,520 B2 | 8/2012 | Chan et al. | |
| 8,417,880 B2 | 4/2013 | Lam et al. | |
| 8,553,468 B2 | 10/2013 | Sabbag et al. | |
| 2009/0073766 A1* | 3/2009 | Shibata | 365/185.03 |
| 2010/0185812 A1* | 7/2010 | Kim | 711/109 |
| 2012/0127807 A1* | 5/2012 | Pio | 365/189.09 |
| 2012/0213005 A1 | 8/2012 | Lee | |
| 2012/0243321 A1 | 9/2012 | Shinagawa | |
| 2013/0176784 A1 | 7/2013 | Cometti et al. | |
| 2013/0182506 A1 | 7/2013 | Milik-Martirosian | |
| 2013/0238836 A1 | 9/2013 | Suzuki et al. | |

FOREIGN PATENT DOCUMENTS

KR   20090068663 A   6/2009

* cited by examiner

*Primary Examiner* — Son Dinh
*Assistant Examiner* — Uyen B Tran
(74) *Attorney, Agent, or Firm* — Volentine & Whitt, PLLC

(57) ABSTRACT

A non-volatile memory device receives a start command through a command line, receives an address through an address line, receives at least one setting value through the address line, receives a confirm command corresponding to the start command through the command line, sets at least one parameter of the non-volatile memory device as the setting value based on the start command, a number of the setting value, and the confirm command, and executes an operation that corresponds to the start command, on a memory cell that corresponds to the address, based on the set parameter.

20 Claims, 11 Drawing Sheets

| START CMD | SV NO | CONFIRM CMD | USAGE OF SV1 | USAGE OF SV2 | USAGE OF SV3 |
|---|---|---|---|---|---|
| READ START CMD | 3 | READ CONFIRM CMD | READ VOLTAGE LEVEL1 | READ VOLTAGE LEVEL2 | READ VOLTAGE LEVEL3 |
| READ START CMD | 1 | READ CONFIRM CMD | READ VOL LEVEL TABLE NUMBER | - | - |
| PGM START CMD | 3 | PGM CONFIRM CMD | PGM START VOLTAGE LEVEL | PGM INCREASING VOLTAGE LEVEL | PGM VERIFYING VOLTAGE LEVEL |
| ERASE START CMD | 2 | ERASE CONFIRM CMD | ERASE START VOLTAGE LEVEL | MAXIMUM ERASE LOOP NUMBER | - |

NON-VOLATILE MEMORY DEVICE AND RELATED METHOD OF OPERATION

CROSS-REFERENCE TO RELATED APPLICATION

This application claims priority under 35 USC §119 to Korean Patent Application No. 10-2014-0016742 filed on Feb. 13, 2014, the subject matter of which is hereby incorporated by reference.

BACKGROUND OF THE INVENTION

Embodiments of the inventive concept relate generally to non-volatile memory devices. More particularly, certain embodiments relate to methods of operating non-volatile memory devices in response to received information.

Semiconductor memory devices can be roughly divided into two categories according to whether they retain stored data when disconnected from power. These categories include volatile memory devices, which lose stored data when disconnected from power, and non-volatile memory devices, which retain stored data when disconnected from power. Examples of volatile memory devices include dynamic random access memory (DRAM) and static random access memory (SRAM), and examples of non-volatile memory devices include read only memory (ROM), magnetoresistive random access memory (MRAM), resistive random access memory (RRAM), and flash memory.

Flash memory is an especially popular form of nonvolatile memory due to attractive features such as relatively high storage density, efficient performance, low cost per bit, and an ability to withstand physical shock. NAND flash memory, for instance, is used in many devices to provide long term data storage.

NAND flash memory devices may be sensitive to changes in environmental factors and variations in manufacturing processes, so the lifetime and performance of these devices may be improved by adjusting operating parameters of the NAND flash memory device according to environmental factors. Such operating parameters may include, e.g., a read voltage level, a program start voltage level, a program increasing voltage level, a program verifying voltage level, an erase start voltage level, and a maximum erase loop number. Unfortunately, however, the operating speed of NAND flash memory devices may be decreased because a significant amount of time may be required to change the operating parameters of the NAND flash memory device.

SUMMARY OF THE INVENTION

In one embodiment of the inventive concept, a non-volatile memory device receives a start command through a command line, receives an address through an address line, receives at least one setting value through the address line, receives a confirm command corresponding to the start command through the command line, sets at least one parameter of the non-volatile memory device as the setting value based on the start command, a number of the setting value, and the confirm command, and executes an operation that corresponds to the start command, on a memory cell that corresponds to the address, based on the set parameter.

In another embodiment of the inventive concept, a non-volatile memory device comprises a memory cell array comprising multiple memory cells, a controller comprising at least one parameter register configured to store at least one parameter, and configured to control operations of the memory cell array based on the parameter. The controller receives a start command and a confirm command through command line, receives an address and at least one setting value through an address line, stores the setting value as the parameter to the parameter register based on the start command, the confirm command, and a number of the setting value, and executes an operation that corresponds to the start command, on a memory cell that corresponds to the address, based on the parameter.

These and other embodiments of the inventive concept can potentially improve the speed of various operations performed by non-volatile memory devices.

BRIEF DESCRIPTION OF THE DRAWINGS

The drawings illustrate selected embodiments of the inventive concept. In the drawings, like reference numbers indicate like features.

FIG. 3 illustrates a parameter mapping table in the non-volatile memory device of FIG. 2, according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

In the description that follows, the terms first, second, third, etc., may be used to describe various features, but the described features should not be limited by these terms. Rather, these terms are used merely to distinguish one feature from another. Thus, a first feature discussed below could be termed a second feature without departing from the teachings of the inventive concept. As used herein, the term "and/or" includes any and all combinations of one or more of the associated listed items.

Where a feature is referred to as being "connected" or "coupled" to another feature, it can be directly connected or coupled to the other feature or intervening features may be present. Other words used to describe the relationship between elements should be interpreted in a similar fashion.

The terminology used herein is for the purpose of describing embodiments only and is not intended to limit the inventive concept. As used herein, the singular forms "a," "an" and "the" are intended to include the plural forms as well, unless the context clearly indicates otherwise. Terms such as "comprises" and/or "comprising," where used in this specification, indicate the presence of stated features, but do not preclude the presence or addition of one or more other features.

In certain alternative embodiments, functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

Figure 1:
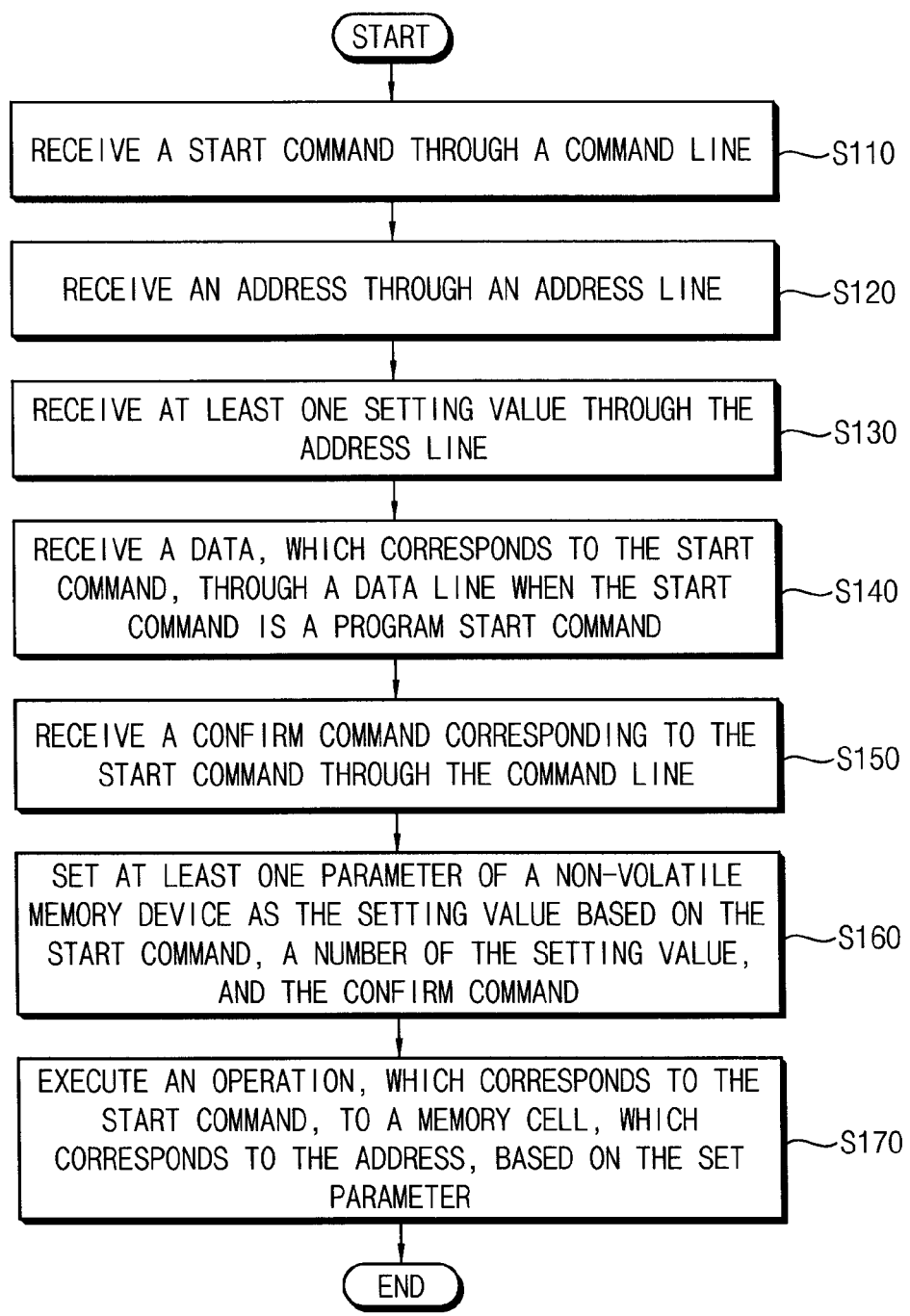
FIG. 1 is a flowchart illustrating a method of operating a non-volatile memory device according to an embodiment of the inventive concept.

FIG. 1 is a flowchart illustrating a method of operating a non-volatile memory device according to an embodiment of the inventive concept. For explanation purposes, it will be assumed that the non-volatile memory device is a NAND flash memory device, although the inventive concept is not limited thereto.

Referring to FIG. 1, the method comprises receiving a start command through a command line (S110), receiving an address through an address line (S120), receiving at least one setting value through the address line (S130), receiving data that corresponds to the start command through a data line where the start command is a program start command (S140), and receiving a confirm command corresponding to the start command through the command line (S150). The method further comprises setting at least one parameter of the non-volatile memory device as the setting value based on the start command, a number of the setting value, and the confirm command (S160), and executing an operation that corresponds to the start command, on a memory cell that corresponds to the address, based on the set parameter (S170). The steps shown in FIG. 1 will be described in further detail with reference to FIGS. 2, 4 through 8.

Setting the parameter of the non-volatile memory device as the setting value (S160) may comprise accessing a parameter mapping table that maps the setting value and the parameter based on the start command, the number of the setting value, and the confirm command. The parameter mapping table will be described with the reference to FIG. 3.

Figure 2:
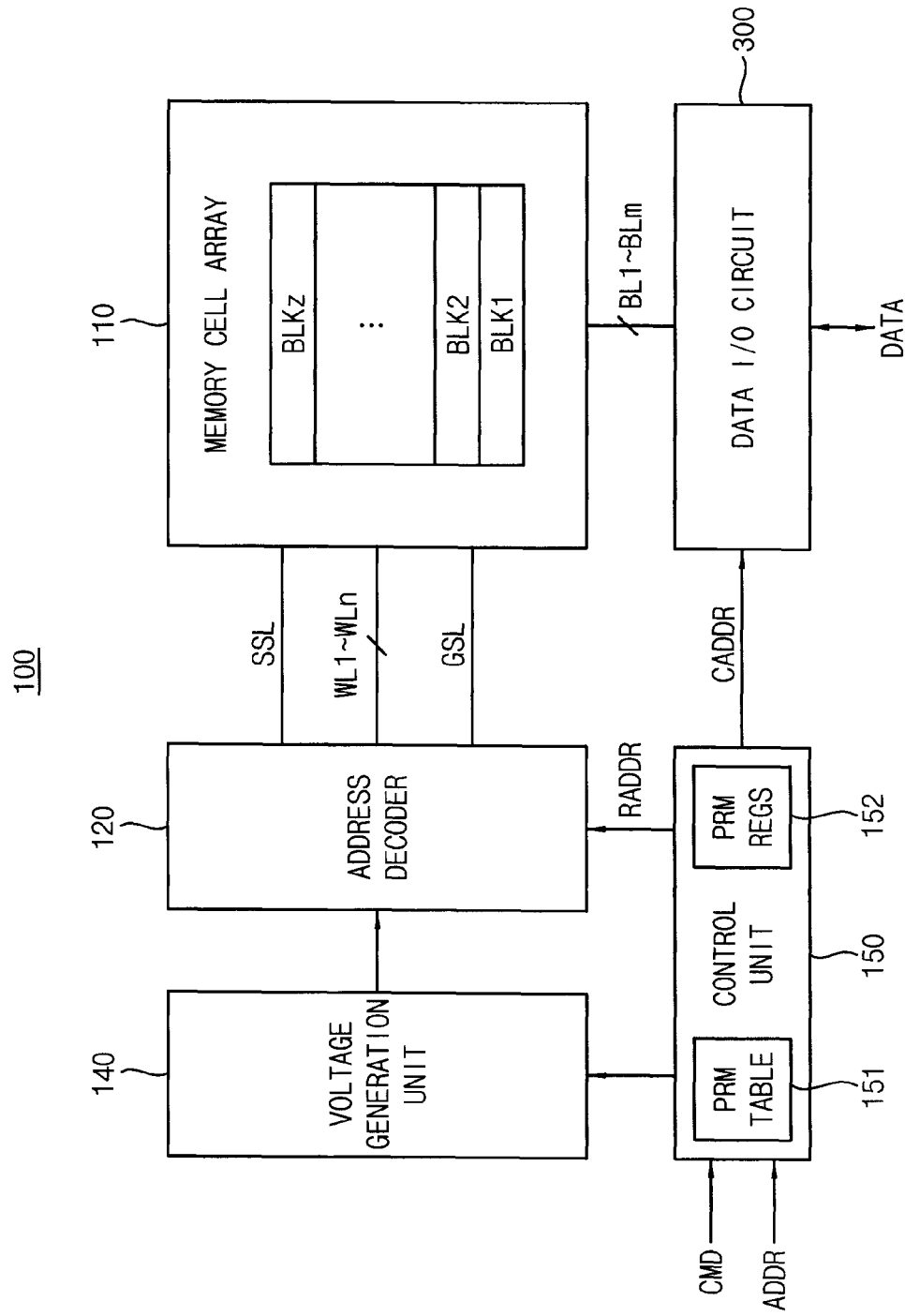
FIG. 2 is a block diagram illustrating a non-volatile memory device according to an embodiment of the inventive concept.

FIG. 2 is a block diagram illustrating a non-volatile memory device 100 according to an embodiment of the inventive concept.

Referring to FIG. 2, non-volatile memory device 100 comprises a memory cell array 110, an address decoder 120, a data input/output (I/O) circuit 130, a voltage generation unit 140, and a control unit 150. Control unit 150 comprises parameter registers 152, and parameter mapping table 151.

Memory cell array 110 comprises multiple memory blocks BLK1, BLK2, ..., BLKz, where z is a positive integer. Each of memory blocks BLK1, BLK2, ..., BLKz may include multiple cell strings. Memory blocks BLK1, BLK2, ..., BLKz may share the bit lines BL1~BLm. Memory cell array 110 performs an erase operation in a unit of a memory block.

In some embodiments, the memory cell in memory cell array 110 may be a single-level cell for storing single-bit data. In another embodiment, the memory cell in memory cell array 110 may be a multi-level cell for storing multi-bit data. In still another embodiment, the memory cell in memory cell array 110 may be a triple-level cell for storing 3-bit data.

Control unit 150 controls operations of non-volatile memory device 100 by controlling voltage generation unit 140, address decoder 120 and data I/O circuit 130 based on a command signal CMD and an address signal ADDR received from an external device such as a memory controller. For example, control unit 150 may control a program operation, a read operation, and the erase operation of non-volatile memory device 100 based on command signal CMD and address signal ADDR.

Control unit 150 receives a start command and a confirm command as command signal CMD through command line. Control unit 150 receives an address as an address signal ADDR and at least one setting value through an address line. Control unit 150 stores the setting value as the parameter in parameter register 152 based on the start command, the confirm command, and a number of the setting value. Control unit 150 stores the setting value as the parameter in parameter register 152 based on parameter mapping table 152. Control unit 150 controls non-volatile memory device 100 to execute an operation that corresponds to the start command, on a memory cell, which corresponds to the address, based on the parameter stored in parameter register 152.

In some embodiments, control unit 150 generates a row address RADDR and a column address CADDR based on address signal ADDR. Control unit 150 provides row address RADDR to address decoder 120 and provides column address CADDR to data I/O circuit 130.

Voltage generation unit 140 generates various voltages required for operations of non-volatile memory device 100. For example, voltage generation unit 140 may generate a program voltage, a pass voltage, and a verification voltage that are used in the program operation. It may also generate a read voltage that is used in the read operation, and an erase voltage that is used in the erase operation. Voltage generation unit 140 generates the voltages based on parameter in parameter register 152.

Address decoder 120 is connected to memory cell array 110 through word lines WL1~WLn, at least one string selection line SSL, and at least one ground selection line GSL. Address decoder 120 selects one of the word lines WL1~WLn based on row address RADDR received from control unit 150, and it provides various voltages received from voltage generation unit 140 to the selected word line and the unselected word lines.

Data I/O circuit 130 is connected to memory cell array 110 through bit lines BL1~BLm. Data I/O circuit 130 selects at least one of bit lines BL1~BLm based on column address CADDR received from control unit 150, output data read from a memory cell connected to the selected at least one bit line to an external device, and write data received from the external device in a memory cell connected to the selected at least one bit line.

In some embodiments, data I/O circuit 130 comprises a sense amplifier, a page buffer, a column selection circuit, a write driver, a data buffer, etc.

FIG. 3 illustrates a parameter mapping table in the non-volatile memory device of FIG. 2, according to an embodiment of the inventive concept.

Referring to FIG. 3, parameters of the mapping table comprise a first read voltage level READ VOLTAGE LEVEL 1, a second read voltage level READ VOLTAGE LEVEL 2, a third read voltage level READ VOLTAGE LEVEL 3, a read voltage level table number READ VOL LEVEL TABLE NUMBER, a program start voltage level PGM START VOLTAGE LEVEL, a program increasing voltage level PGM INCREASING VOLTAGE LEVEL, a program verifying voltage level PGM VERIFYING VOLTAGE LEVEL, an erase start voltage level ERASE START VOLTAGE LEVEL, and a maximum erase loop number MAXIMUM ERASE LOOP NUMBER.

Setting the parameter of the non-volatile memory device as the setting value (S160) may set first read voltage level READ VOLTAGE LEVEL 1 of non-volatile memory device 100 as a first setting value SV1, it may set second read voltage level READ VOLTAGE LEVEL 2 of non-volatile memory device 100 as a second setting value SV2, and it may set third read voltage level READ VOLTAGE LEVEL 3 of non-volatile memory device 100 as a third setting value SV3, where start command START CMD is read start command READ START CMD, the setting value comprises first setting value SV1, second setting value SV2, and the third setting value SV3, and the number of the setting value is 3, and confirm command CONFIRM CMD is read confirm command READ CONFIRM CMD, according to a first mapping case stored in parameter mapping table 200. The first mapping case of parameter mapping table 200 will be described with the reference to FIG. 5.

Setting the parameter of the non-volatile memory device as the setting value (S160) may set read voltage level table number READ VOL LEVEL TABLE NUMBER of non-volatile memory device 100 as a first setting value SV1, where start command START CMD is the read start command READ START CMD, the setting value comprises the first setting value SV1, and the number of the setting value is 1, and confirm command CONFIRM CMD is the read confirm command READ CONFIRM CMD, according to a second mapping case stored in parameter mapping table 200. The second mapping case of parameter mapping table 200 will be described with the reference to FIG. 6.

In certain embodiments, where the read voltage level table number READ VOL LEVEL TABLE NUMBER is set to 1, it may be pre-determined that the first read voltage level READ VOLTAGE LEVEL 1 is 10 mV, the second read voltage level READ VOLTAGE LEVEL 2 is 5 mV, and the third read voltage level READ VOLTAGE LEVEL 3 is 30 mV.

In certain other embodiments, where the read voltage level table number READ VOL LEVEL TABLE NUMBER is set to 2, it may be pre-determined that first read voltage level READ VOLTAGE LEVEL 1 is 5 mV, second read voltage level READ VOLTAGE LEVEL 2 is 40 mV, and third read voltage level READ VOLTAGE LEVEL 3 is 10 mV.

Setting the parameter of the non-volatile memory device as the setting value (S160) may set the program start voltage level PGM START VOLTAGE LEVEL of non-volatile memory device 100 as a first setting value SV1; it may set the program increasing voltage level PGM INCREASING VOLTAGE LEVEL of non-volatile memory device 100 as a second setting value SV2; it may set the program verifying voltage level PGM VERIFYING VOLTAGE LEVEL of non-volatile memory device 100 as a third setting value SV3, where start command START CMD is program start command PGM START CMD, the setting value comprises first setting value SV1, second setting value SV2, and third setting value SV3, and the number of the setting value is 3, and confirm command CONFIRM CMD is program confirm command PGM CONFIRM CMD, according to a third mapping case stored in parameter mapping table 200. The third mapping case of parameter mapping table 200 will be described with the reference to FIG. 7.

Setting the parameter of the non-volatile memory device as the setting value (S160) may set the erase start voltage level ERASE START VOLTAGE LEVEL of non-volatile memory device 100 as a first setting value SV1, may set the maximum erase loop number MAXIMUM ERASE LOOP NUMBER of non-volatile memory device 100 as a second setting value SV2, where start command START CMD is the erase start command ERASE START CMD, the setting value comprises first setting value SV1, and second setting value SV2, and the number of the setting value is 2, and confirm command CONFIRM CMD is erase confirm command ERASE CONFIRM CMD, according to the fourth mapping case stored in parameter mapping table 200. The fourth mapping case of parameter mapping table 200 will be described with the reference to FIG. 8.

Parameter mapping table 200 may comprise mapping cases other than the first through fourth mapping cases.

FIGS. 4 through 8 are timing diagrams illustrating operations of the non-volatile memory device according to an embodiment of the inventive concept.

Figure 4:
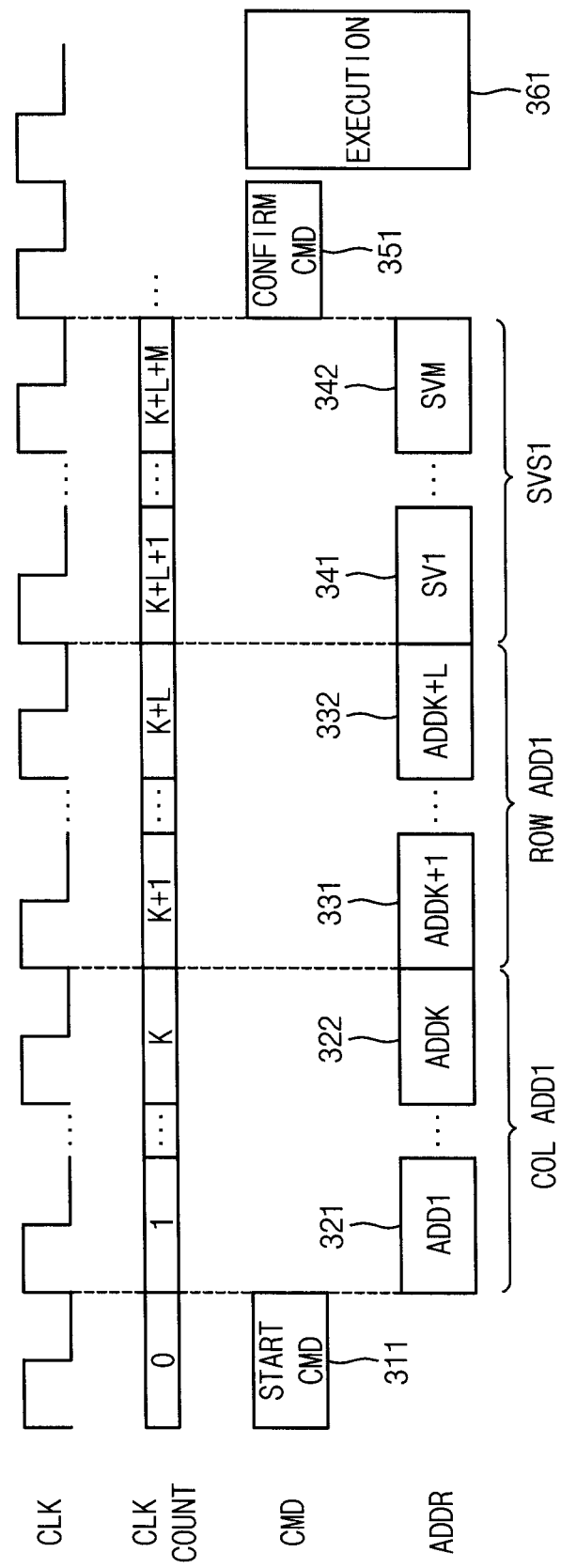
FIG. 4 is a timing diagram illustrating the operation of the non-volatile memory device according to an embodiment of the inventive concept.

Referring to FIG. 4, a clock count CLK COUNT is increased at every rising edge of clock signal CLK. Alternatively, clock count CLK COUNT could be increased at every falling edge of clock signal CLK.

A column address COL ADD 1 comprises a first address 321 through a K-th address 322. A row address ROW ADD 1 comprises a (K+1)-th address 331 through a (K+L)-th address 332. Setting values SVS 1 comprise a first setting value 341 through a (M)-th setting value SVM.

Where clock count CLK COUNT is 0, control unit 150 receives start command 311 as command signal CMD through the command line (S110). Where clock count CLK COUNT has been increased from 1 through K+L, control unit 150 receives column address COL ADD 1 and row address ROW ADD 1 as address signal ADDR through the address line (S120). Where clock count CLK COUNT has been increased from K+L+1 through K+L+M, control unit 150 receives setting values SVS 1 as address signal ADDR through the address line (S130). After control unit 150 receives setting values SVS 1, control unit 150 receives confirm command 351 as command signal CMD through the command line (S150).

After control unit 150 receives confirm command 351 as command signal CMD, control unit 150 stores setting values SVS 1 to parameter register 152 corresponding to a parameter corresponding to start command 311, the number of setting values SVS 1, and confirm command 351 during execution period 361, and control unit 150 controls non-volatile memory device 100 to execute an operation corresponding to start command 311 on a memory cell corresponding to column address COL ADD 1, and row address ROW ADD 1 based on the parameter (S160 and S170).

Figure 5:
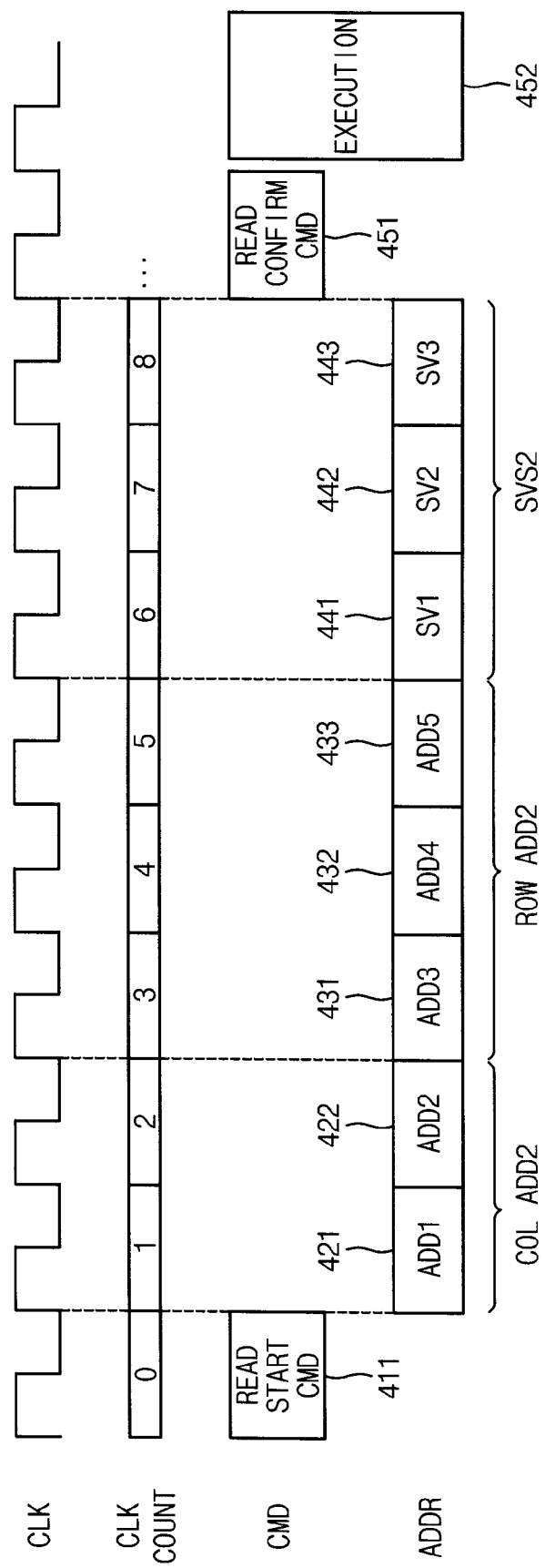
FIG. 5 is a timing diagram illustrating the operation of the non-volatile memory device according to an embodiment of the inventive concept.

FIG. 5 illustrates operations of the first mapping case of the parameter mapping table of FIG. 3, according to an embodiment of the inventive concept.

Referring to FIG. 5, a column address COL ADD 2 comprises a first address 421, and a second address 422. A row address ROW ADD 2 comprises a third address 431, a fourth address 432, and a fifth address 433. Setting values SVS 2 comprises a first setting value SV1 441, a second setting value 442, and a third setting value 443.

Where clock count CLK COUNT is 0, control unit 150 receives read start command READ START CMD 411 as command signal CMD through the command line (S110). While clock count CLK COUNT has been increased from 1 through 5, control unit 150 may receive column address COL ADD 2 and row address ROW ADD 2 as address signal ADDR through the address line (S120). While clock count CLK COUNT has been increased from 6 through 8, control unit 150 may receive setting values SVS 2 as address signal ADDR through the address line (S130). After control unit 150 receives setting values SVS 2, control unit 150 may receive the read confirm command 451 as command signal CMD through the command line (S150).

After control unit 150 receives read confirm command 451 as command signal CMD, control unit 150 stores a first setting value 441 to parameter register 152 corresponding to first read voltage level READ VOLTAGE LEVEL 1 parameter, stores a second setting value 442 to parameter register 152 corresponding to the second read voltage level READ VOLTAGE LEVEL 2 parameter, stores a third setting value 443 to parameter register 152 corresponding to the third read voltage level READ VOLTAGE LEVEL 3 parameter based on the first mapping case corresponding to read start command 411, the number of setting values SVS 2 (3), and read confirm command 451 in parameter mapping table 200 during execution period EXECUTION 461. Control unit 150 controls non-volatile memory device 100 to execute a read operation on a memory cell corresponding to column address COL ADD 2, and row address ROW ADD 2 based on the parameters stored in parameter register 152 (S160 and S170).

Figure 6:
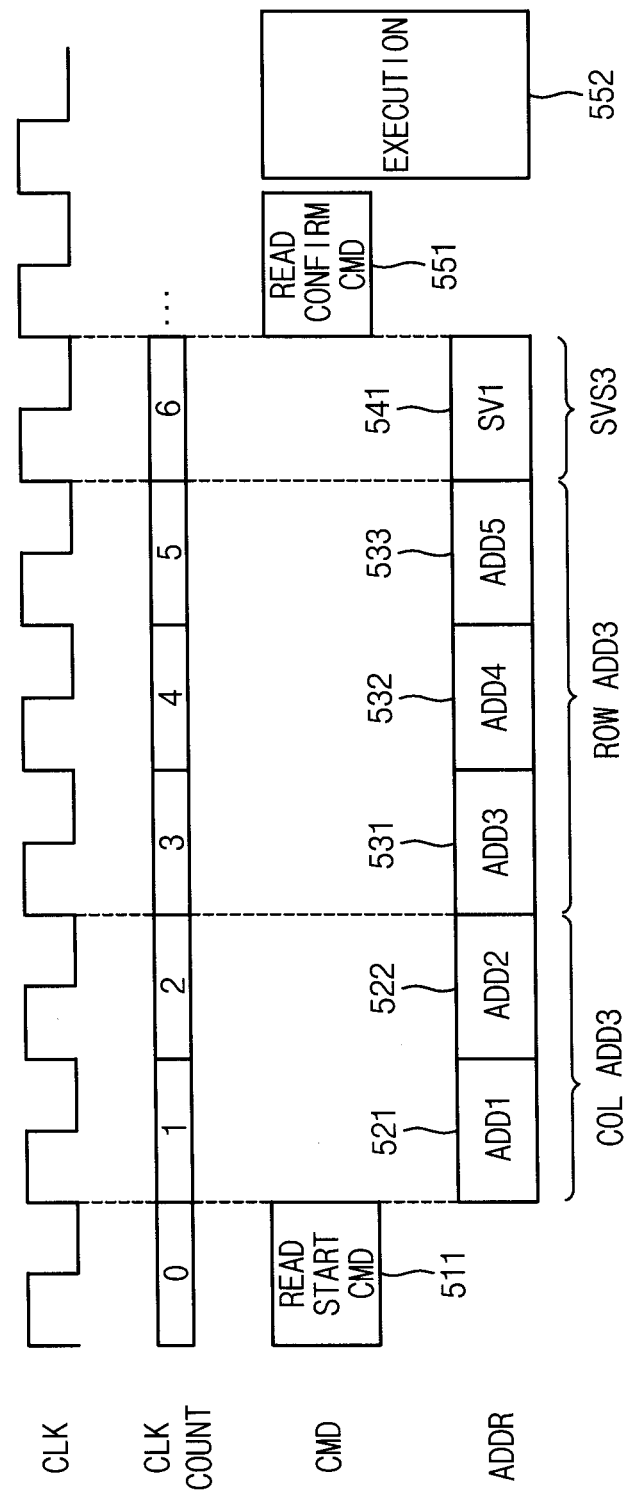
FIG. 6 is a timing diagram illustrating the operation of the non-volatile memory device according to an embodiment of the inventive concept.

FIG. 6 illustrates operations of the second mapping case of the parameter mapping table of FIG. 3, according to an embodiment of the inventive concept.

Referring to FIG. 6, a column address COL ADD 3 comprises a first address 521, and a second address 522. A row address ROW ADD 3 comprises a third address 531, a fourth address 532, and a fifth address 533. Setting values SVS 3 comprise a first setting value SV1 541.

Where clock count CLK COUNT is 0, control unit 150 receives read start command READ START CMD 511 as command signal CMD through the command line (S110). Where clock count CLK COUNT has been increased from 1 through 5, control unit 150 receives column address COL ADD 3 and row address ROW ADD 3 as address signal ADDR through the address line (S120). Where clock count CLK COUNT is 6, control unit 150 receives setting values SVS 3 as address signal ADDR through the address line (S130). After control unit 150 receives setting values SVS 3, control unit 150 receives read confirm command 551 as command signal CMD through the command line (S150).

After control unit 150 receives read confirm command 551 as command signal CMD, control unit 150 stores a first setting value 541 in parameter register 152 corresponding to the read voltage level table number READ VOL LEVEL TABLE NUMBER parameter based on the second mapping case corresponding to read start command 511, the number of setting values SVS 3 (1), and read confirm command 551 in parameter mapping table 200 during execution period 552. Control unit 150 controls non-volatile memory device 100 to execute a read operation on a memory cell corresponding to column address COL ADD 3, and row address ROW ADD 3 based on the parameters stored in parameter register 152 (S160 and S170).

Figure 7:
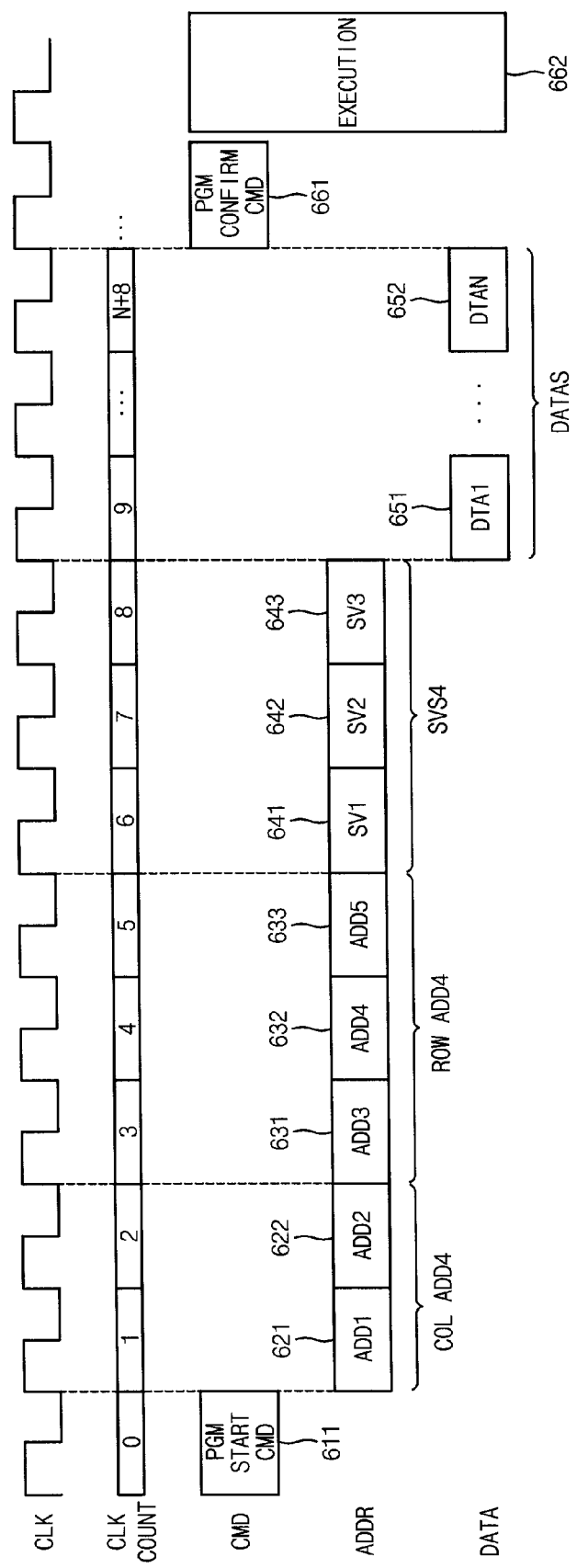
FIG. 7 is a timing diagram illustrating the operation of the non-volatile memory device according to an embodiment of the inventive concept.

FIG. 7 illustrates operations of the third mapping case of the parameter mapping table of FIG. 3.

Referring to FIG. 7, a column address COL ADD4 comprises a first address 621, and a second address 622. A row address ROW ADD4 comprises a third address 631, a fourth address 632, and a fifth address 633. Setting values SVS4 comprise a first setting value SV1 641, a second setting value SV2 642, and a third setting value SV3 643. Data DATA comprises a first data DTA1 651 through a (N)-th data DTAN 652.

Where clock count CLK COUNT is 0, control unit 150 receives program start command PGM START CMD 611 as command signal CMD through the command line (S110). While clock count CLK COUNT has been increased from 1 through 5, control unit 150 receives column address COL ADD4 and row address ROW ADD4 as address signal ADDR through the address line (S120). While clock count CLK COUNT has been increased from 6 through 8, control unit 150 receives setting values SVS4 as address signal ADDR through the address line (S130). Where clock count CLK COUNT has increased from 9 to N+8, control unit 150 receives data DATAS as data signal DATA through the data line (S140). After control unit 150 receives data DATAS, control unit 150 receives program confirm command 651 as command signal CMD through the command line (S150).

After control unit 150 receives program confirm command 651 as command signal CMD, control unit 150 stores a first setting value 641 to parameter register 152 corresponding to the program start voltage level parameter, stores a second setting value 642 to parameter register 152 corresponding to the program increasing voltage level parameter, stores a third setting value 643 to parameter register 152 corresponding to the program verifying voltage level parameter based on the third mapping case corresponding to program start command 611, the number of setting values SVS4 (3), and program confirm command 651 in parameter mapping table 200 during execution period EXECUTION 652. Control unit 150 controls non-volatile memory device 100 to execute a read operation on a memory cell corresponding to column address COL ADD 2, and row address ROW ADD 2 based on the parameters stored in parameter register 152 (S160 and S170).

Figure 8:
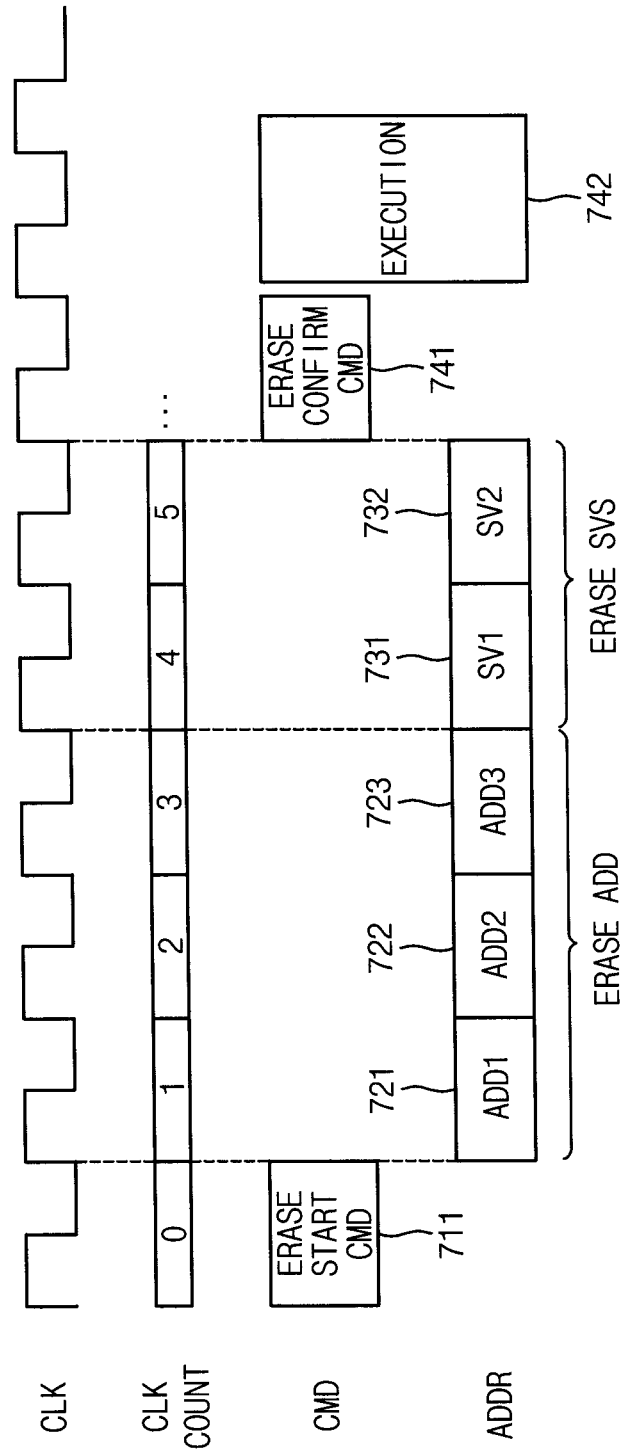
FIG. 8 is a timing diagram illustrating the operation of the non-volatile memory device according to an embodiment of the inventive concept.

FIG. 8 illustrates operations of the fourth mapping case of the parameter mapping table of FIG. 3, according to an embodiment of the inventive concept.

Referring to FIG. 8, an erase address ERASE ADD comprises a first address 721, a second address 722, and a third address 723. Setting values ERASE SVS comprise a first setting value 731, and a second setting value 732.

Where clock count CLK COUNT is 0, control unit 150 receives erase start command 711 as command signal CMD through the command line (S110). While clock count CLK COUNT is increased from 1 through 3, control unit 150 receives erase address ERASE ADD as address signal ADDR through the address line (S120). While clock count CLK COUNT is increased from 4 through 5, control unit 150 receives setting values ERASE SVS as address signal ADDR through the address line (S130). After control unit 150 receives setting values ERASE SVS, control unit 150 receives erase confirm command 741 as command signal CMD through the command line (S150).

After control unit 150 receives erase confirm command 741 as command signal CMD, control unit 150 stores a first setting value 731 in parameter register 152 corresponding to the erase start voltage level parameter, stores a second setting value 732 to parameter register 152 corresponding to the maximum erase loop number parameter based on the fourth mapping case corresponding to erase start command 711, the number of setting values ERASE SVS (2), and erase confirm command 741 in parameter mapping table 200 during execution period 742. CONTROL UNIT 150 controls non-volatile memory device 100 to execute an erase operation on a memory cell corresponding to erase address ERRASE ADD based on the parameters stored in parameter register 152 (S160 and S170).

Figure 9:
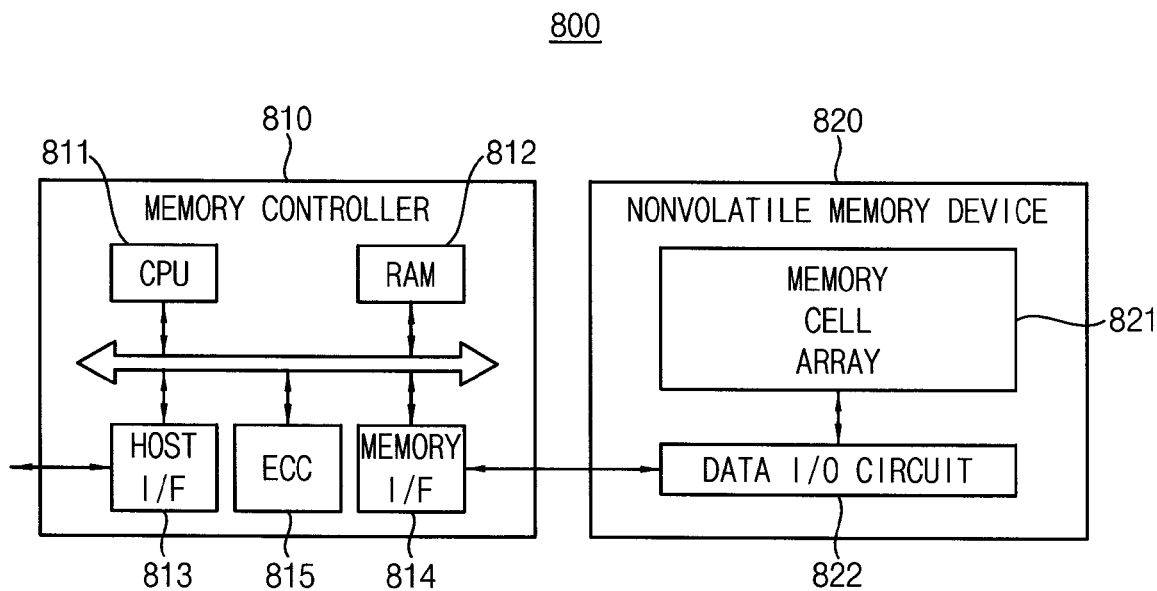
FIG. 9 is a block diagram illustrating a memory system according to an embodiment of the inventive concept.

FIG. 9 is a block diagram illustrating a memory system 800 according to an embodiment of the inventive concept.

Referring to FIG. 9, memory system 800 comprises a memory controller 810 and a non-volatile memory device 820.

Non-volatile memory device 820 comprises a memory cell array 821 and a data I/O circuit 822. Memory cell array 821 is formed on a substrate in a three-dimensional structure. For example, memory cells in memory cell array 821 may be formed in a direction perpendicular to the substrate. The memory cells in memory cell array 821 are connected to multiple word lines stacked in a direction perpendicular to the substrate, and multiple bit lines disposed in a direction parallel to the substrate. Data I/O circuit 822 is connected to memory cell array 821 through the bit lines. Data I/O circuit 822 selects at least one of the bit lines, outputs data read from a memory cell connected to the selected at least one bit line to memory controller 810, and writes data received from memory controller 810 in a memory cell connected to the selected at least one bit line.

During an erase operation, non-volatile memory device 820 applies a relatively low voltage to a word line disposed at relatively large height, and it applies a relatively high voltage to a word line disposed at relatively small height to reduce differences between erase speeds of the memory cells according to heights from the substrate. Therefore, non-volatile memory device 820 may effectively reduce the threshold voltage distribution of the memory cells in an erased state after the erase operation is performed on the memory cells.

During a program operation, non-volatile memory device 820 applies a program voltage having a level that increases step by step from a relatively low voltage by a unit of a step level as program loops are repeated to a word line connected to a target memory cell where a height of the word line is relatively small. It also applies a program voltage having a level that increases step by step from a relatively high voltage by a unit of the step level as program loops are repeated, to a word line connected to a target memory cell where a height of the word line is relatively large. Therefore, a program speed of the target memory cell disposed at a relatively higher portion among the memory cells may be increased to a program speed of the target memory cell disposed at a relatively lower portion among the memory cells, such that overall program speed of non-volatile memory device 820 may be increased.

Non-volatile memory device 820 may be implemented with non-volatile memory device 100 of FIG. 2. Memory cell array 821 may be implemented with memory cell array 110 in non-volatile memory device 100 of FIG. 2. Data input/output circuit 822 may be implemented with data input/output circuit 130 in non-volatile memory device 100 of FIG. 2.

Memory controller 810 controls non-volatile memory device 820. Memory controller 810 may control data transfer between an external host and non-volatile memory device 820.

Memory controller 810 comprises a central processing unit 811, a buffer memory 812, a host interface 813 and a memory interface 814.

Central processing unit 811 may perform operations for the data transfer. Buffer memory 812 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

Buffer memory 812 may be an operational memory of central processing unit 811. In some embodiments, buffer memory 812 may be included in memory controller 810. In some other embodiments, buffer memory 812 may be outside of memory controller 810.

Host interface 813 is coupled to the host, and memory interface 814 is coupled to non-volatile memory device 820. Central processing unit 811 communicates with the host via host interface 813. For example, host interface 813 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on.

Further, central processing unit 811 may communicate with non-volatile memory device 820 via memory interface 814. In some embodiments, memory controller 810 further comprises an error correction block 815 for error correction. Memory controller 810 may be built in non-volatile memory device 820, or memory controller 810 and non-volatile memory device 820 may be implemented as separate chips. Memory system 800 may be implemented as a memory card, a solid state drive, and so on.

Figure 10:
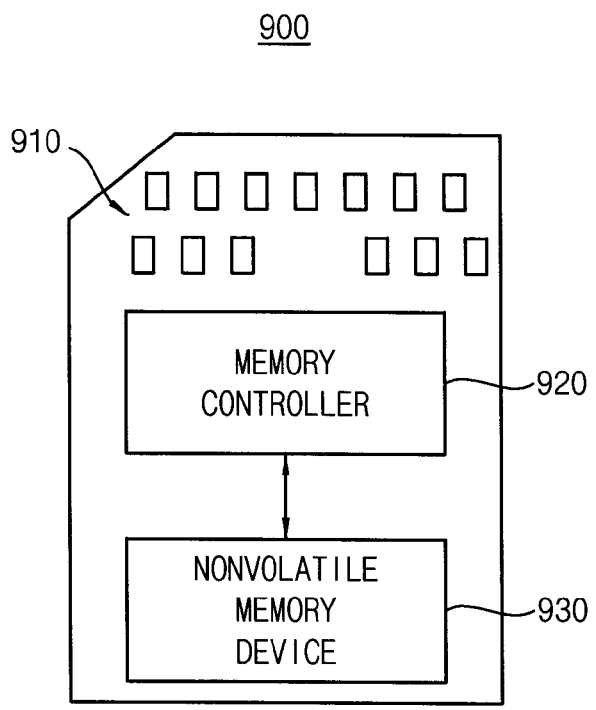
FIG. 10 is a block diagram illustrating a memory card according to an embodiment of the inventive concept.

FIG. 10 is a block diagram illustrating a memory card 900 according to an embodiment of the inventive concept.

Referring to FIG. 10, a memory card 900 comprises multiple connecting pins 910, a memory controller 920, and a non-volatile memory device 930. Connecting pins 910 are coupled to an external host to transfer signals between the host and memory card 900. Connecting pins 910 may include a clock pin, a command pin, a data pin and/or a reset pin.

Memory controller 920 receives data from the host, and it stores the received data in non-volatile memory device 930.

Non-volatile memory device 930 may comprise a memory cell array formed on a substrate in a three-dimensional structure. Memory cells in the memory cell array may be formed in a direction perpendicular to the substrate. The memory cells in the memory cell array may be connected to multiple word lines stacked in a direction perpendicular to the substrate, and multiple bit lines disposed in a direction parallel to the substrate.

During an erase operation, non-volatile memory device 930 applies a relatively low voltage to a word line disposed at relatively large height and applies a relatively high voltage to a word line disposed at relatively small height to reduce differences between erase speeds of the memory cells according to heights from the substrate. Therefore, non-volatile memory device 930 may effectively reduce the threshold voltage distribution of the memory cells in an erased state after the erase operation is performed on the memory cells.

During a program operation, non-volatile memory device 930 applies a program voltage with a level that increases step by step from a relatively low voltage by a unit of a step level as program loops are repeated, to a word line connected to a target memory cell where a height of the word line is relatively small. On the other hand, it applies a program voltage with a level that increases step by step from a relatively high voltage by a unit of the step level as program loops are repeated, to a word line connected to a target memory cell where a height of the word line is relatively large. Therefore, a program speed of the target memory cell disposed at a relatively higher portion among the memory cells may be increased to a program speed of the target memory cell disposed at a relatively lower portion among the memory cells, such that overall program speed of non-volatile memory device 930 may be increased.

Non-volatile memory device 930 may be implemented with non-volatile memory device 100 of FIG. 2, for example.

Memory card 900 may include a MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, and so on.

In some embodiments, memory card 900 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, and so on.

Figure 11:
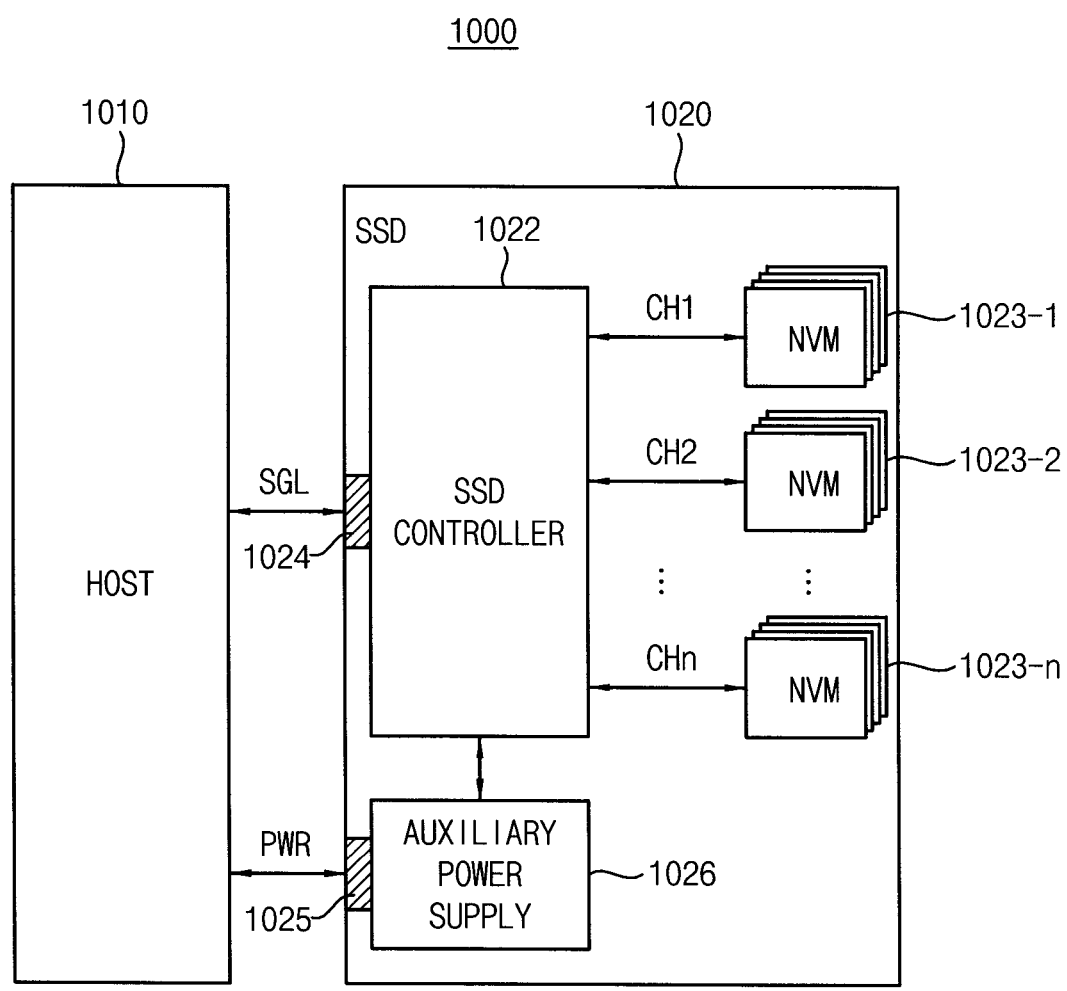
FIG. 11 is a block diagram illustrating a solid-state drive system according to an embodiment of the inventive concept.

FIG. 11 is a block diagram illustrating an SSD system 1000 according to an embodiment of the inventive concept.

Referring to FIG. 11, SSD system 1000 comprises a host 1010 and a SSD 1020. SSD 1020 comprises first through n-th non-volatile memory devices 1023-1, 1023-2, . . . , 1023-$n$ and a SSD controller 1022. Here, n is an integer greater than or equal to two. First through n-th non-volatile memory devices 1023-1, 1023-2, . . . , 1023-$n$ may be used as a storage medium of SSD 1020.

Each of the first through n-th non-volatile memory devices 1023-1, 1023-2, . . . , 1023-$n$ comprises a memory cell array formed on a substrate in a three-dimensional structure. Memory cells in the memory cell array are formed in a direction perpendicular to the substrate. The memory cells in the memory cell array are connected to multiple word lines stacked in a direction perpendicular to the substrate, and multiple bit lines disposed in a direction parallel to the substrate.

During an erase operation, each of the first through n-th non-volatile memory devices 1023-1, 1023-2, . . . , 1023-$n$ applies a relatively low voltage to a word line disposed at relatively large height, and it applies a relatively high voltage to a word line disposed at relatively small height to reduce differences between erase speeds of the memory cells according to heights from the substrate. Therefore, each of the first through n-th non-volatile memory devices 1023-1, 1023-2, . . . , 1023-$n$ may effectively reduce the threshold voltage distribution of the memory cells in an erased state after the erase operation is performed on the memory cells.

During a program operation, each of first through n-th non-volatile memory devices 1023-1, 1023-2, . . . , 1023-$n$ may apply a program voltage, which has a level increasing step by step from a relatively low voltage by a unit of a step level as program loops are repeated, to a word line connected to a target memory cell where a height of the word line is relatively small, and apply a program voltage, which has a level increasing step by step from a relatively high voltage by a unit of the step level as program loops are repeated, to a word line connected to a target memory cell where a height of the word line is relatively large. Therefore, a program speed of the target memory cell disposed at a relatively higher portion among the memory cells may be increased to a program speed of the target memory cell disposed at a relatively lower portion among the memory cells, such that overall program speed of each of the first through n-th non-volatile memory devices 1023-1, 1023-2, . . . , 1023-$n$ may be increased.

Each of the first through n-th non-volatile memory devices 1023-1, 1023-2, . . . , 1023-$n$ may be implemented with non-volatile memory device 100 of FIG. 2, for example.

SSD controller 1022 is coupled to the first through n-th non-volatile memory devices 1023-1, 1023-2, . . . , 1023-$n$ by first through n-th channels CH1, CH2, . . . , CHn, respectively. SSD controller 1022 exchanges a signal SGL with host 1010 through a signal connector 1024. Signal SGL comprises a command, an address and data. SSD controller 1022 performs a program operation and a read operation on the first through n-th non-volatile memory devices 1023-1, 1023-2, . . . , 1023-$n$ according to the command received from host 1010.

SSD 1020 further comprises an auxiliary power supply 1026. Auxiliary power supply 1026 receives power PWR from host 1010 through a power connector 1025 and provides power to SSD controller 1022. Auxiliary power supply 1026 may be placed inside or outside SSD 1020. For example, auxiliary power supply 1026 may be placed in a main board and provide auxiliary power to SSD 1020.

Figure 12:
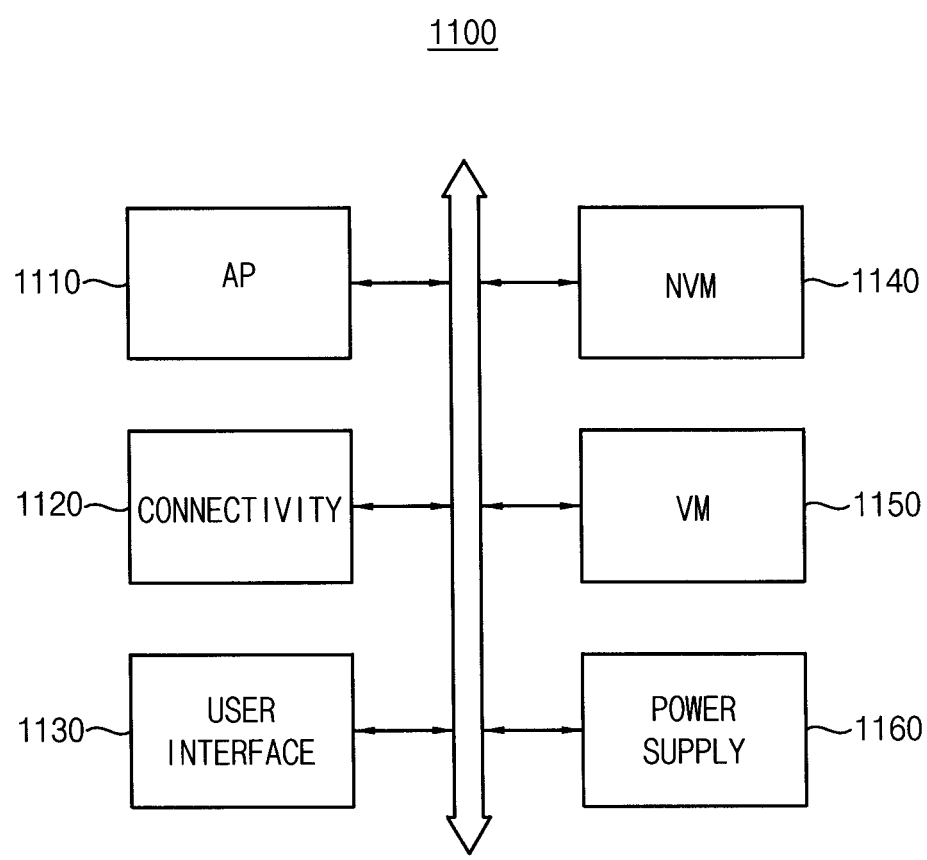
FIG. 12 is a block diagram illustrating a mobile system according to an embodiment of the inventive concept.

FIG. 12 is a block diagram illustrating a mobile system 1100 according to an embodiment of the inventive concept.

Referring to FIG. 12, mobile system 1100 comprises an application processor AP 1100, a connectivity unit 1120, a user interface 1130, a non-volatile memory device NVM 1140, a volatile memory device VM 1150 and a power supply 1160.

In some embodiments, mobile system 1100 may be a mobile phone, a smart phone, a personal digital assistant (PDA), a portable multimedia player (PMP), a digital camera, a music player, a portable game console, a navigation system, etc.

Application processor 1100 may execute applications, such as a web browser, a game application, a video player, etc. In some embodiments, application processor 1100 may include a single core or multiple cores. For example, application processor 1100 may be a multi-core processor, such as a dual-core processor, a quad-core processor, a hexa-core processor, etc. Application processor 1100 may include an internal or external cache memory.

Connectivity unit 1120 may perform wired or wireless communication with an external device. For example, connectivity unit 1120 may perform Ethernet communication, near field communication (NFC), radio frequency identification (RFID) communication, mobile telecommunication, memory card communication, universal serial bus (USB) communication, etc. In some embodiments, connectivity unit 1120 may include a baseband chipset that supports communications, such as global system for mobile communications (GSM), general packet radio service (GPRS), wideband code division multiple access (WCDMA), high speed downlink/uplink packet access (HSxPA), etc.

Non-volatile memory device 1140 may store a boot image for booting mobile system 1100. Non-volatile memory device 1140 may comprise a memory cell array formed on a substrate in a three-dimensional structure. Memory cells in the memory cell array may be formed in a direction perpendicular to the substrate. The memory cells in the memory cell array may be connected to multiple word lines, which are stacked in a direction perpendicular to the substrate, and multiple bit lines, which are formed in a direction parallel to the substrate.

During an erase operation, non-volatile memory device 1140 may apply a relatively low voltage to a word line disposed at relatively large height and apply a relatively high voltage to a word line disposed at relatively small height to reduce differences between erase speeds of the memory cells according to heights from the substrate. Therefore, non-volatile memory device 1140 may effectively reduce the threshold voltage distribution of the memory cells in an erased state after the erase operation is performed on the memory cells.

During a program operation, non-volatile memory device 1140 applies a program voltage with a level that increases step by step from a relatively low voltage by a unit of a step level as program loops are repeated to a word line connected to a target memory cell where a height of the word line is relatively small. On the other hand, it applies a program voltage with a level that increases step by step from a relatively high voltage by a unit of the step level as program loops are repeated, to a word line connected to a target memory cell where a height of the word line is relatively large. Therefore, a program speed of the target memory cell disposed at a relatively higher portion among the memory cells may be increased to a program speed of the target memory cell disposed at a relatively lower portion among the memory cells, such that overall program speed of non-volatile memory device 1140 may be increased.

Non-volatile memory device 1140 may be implemented with non-volatile memory device 100 of FIG. 2. A structure and an operation of non-volatile memory device 1140 will be omitted here.

Volatile memory device 1150 may store data processed by application processor 1110, or may operate as a working memory.

User interface 1130 may include at least one input device, such as a keypad, a touch screen, etc., and at least one output device, such as a speaker, a display device, etc.

Power supply 1160 may supply a power supply voltage to mobile system 3000.

In some embodiments, mobile system 1100 may further include an image processor, and/or a storage device, such as a memory card, a solid state drive (SSD), a hard disk drive (HDD), a CD-ROM, etc.

In some embodiments, mobile system 1100 and/or components of mobile system 1100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A method of operating a non-volatile memory device, comprising:
   receiving a start command through a command line;
   receiving an address through an address line;
   receiving at least one setting value through the address line;
   receiving a confirm command corresponding to the start command through the command line;
   setting at least one parameter of the non-volatile memory device as the setting value based on the start command, a number of the setting value, and the confirm command; and
   executing an operation that corresponds to the start command, on a memory cell that corresponds to the address, based on the set parameter.

2. The method of claim 1, further comprising, where the start command is a program start command, receiving data that corresponds to the start command through a data line.

3. The method of claim 1, wherein setting the parameter of the non-volatile memory device as the setting value comprises setting the parameter of the non-volatile memory device as the setting value by accessing a parameter mapping table that maps the setting value and the parameter based on the start command, the number of the setting value, and the confirm command.

4. The method of claim 1, wherein setting the parameter of the non-volatile memory device as the setting value comprises:
   setting a first read voltage level as a first setting value, setting a second read voltage level as a second setting value, and setting a third read voltage level as a third setting value, where the start command is a read start command, the confirm command is a read confirm command, the number of the setting value is 3, and the setting value includes the first setting value, the second setting value, and the third setting value.

5. The method of claim 1, wherein setting the parameter of the non-volatile memory device as the setting value comprises:
   setting a read voltage level table number as a first setting value where the start command is a read start command, the confirm command is a read confirm command, the number of the setting value is 1, and the setting value comprises the first setting value.

6. The method of claim 1, wherein setting the parameter of the non-volatile memory device as the setting value comprises:
   setting a program start voltage level of the non-volatile memory device as a first setting value, setting a program increasing voltage level of the non-volatile memory device as a second setting value, and setting a program verifying voltage level of the non-volatile memory device as a third setting value, where the start command is a program start command, the confirm command is a program confirm command, the number of the setting value is 3, and the setting value includes the first setting value, the second setting value, and the third setting value.

7. The method of claim 1, wherein setting the parameter of the non-volatile memory device as the setting value comprises:
   setting an erase start voltage level of the non-volatile memory device as a first setting value, and setting a maximum erase loop number as a second setting value where the start command is an erase start command, the confirm command is an erase confirm command, the number of the setting value is 2, and the setting value comprises the first setting value, and the second setting value.

8. The method of claim 1, wherein the address comprises multiple first addresses that represent a row address of the non-volatile memory device, and multiple second addresses that represent a column address of the non-volatile memory device, where the start command is a read start command or a program start command.

9. The method of claim 1, wherein the non-volatile memory device is a NAND flash memory device.

10. A non-volatile memory device, comprising:
a memory cell array comprising multiple memory cells;
a controller comprising at least one parameter register configured to store at least one parameter, and configured to control operations of the memory cell array based on the parameter,
wherein the controller receives a start command and a confirm command through a command line, receives an address and at least one setting value through an address line, stores the setting value as the parameter to the parameter register based on the start command, the confirm command, and a number of the setting value, and executes an operation that corresponds to the start command, on a memory cell that corresponds to the address, based on the parameter.

11. The non-volatile memory device of claim 10 further comprising:
a data input/output circuit configured to receive first data that corresponds to a read start command, from the memory cell array through a data line where the start command is the read start command, the data input/output circuit configured to transmit a second data that corresponds to a program start command, to the memory cell array through the data line where the start command is the program start command.

12. The non-volatile memory device of claim 10, wherein the controller further comprises a parameter mapping table that maps the setting value and the parameter based on the start command, the number of the setting value, and the confirm command.

13. The non-volatile memory device of claim 11, wherein the controller stores the setting value as the parameter in the parameter register based on the parameter mapping table.

14. The non-volatile memory device of claim 10, wherein, where the start command is a program start command, the controller receives data that corresponds to the start command through a data line.

15. The non-volatile memory device of claim 10, wherein the controller sets a first read voltage level as a first setting value, sets a second read voltage level as a second setting value, and sets a third read voltage level as a third setting value, where the start command is a read start command, the confirm command is a read confirm command, the number of the setting value is 3, and the setting value includes the first setting value, the second setting value, and the third setting value.

16. The non-volatile memory device of claim 10, wherein the controller sets a read voltage level table number as a first setting value where the start command is a read start command, the confirm command is a read confirm command, the number of the setting value is 1, and the setting value comprises the first setting value.

17. The non-volatile memory device of claim 10, wherein the controller sets a program start voltage level of the non-volatile memory device as a first setting value, sets a program increasing voltage level of the non-volatile memory device as a second setting value, and sets a program verifying voltage level of the non-volatile memory device as a third setting value, where the start command is a program start command, the confirm command is a program confirm command, the number of the setting value is 3, and the setting value includes the first setting value, the second setting value, and the third setting value.

18. The non-volatile memory device of claim 10, wherein the controller sets an erase start voltage level of the non-volatile memory device as a first setting value, and sets a maximum erase loop number as a second setting value where the start command is an erase start command, the confirm command is an erase confirm command, the number of the setting value is 2, and the setting value comprises the first setting value, and the second setting value.

19. The non-volatile memory device of claim 10, wherein the address comprises multiple first addresses that represent a row address of the non-volatile memory device, and multiple second addresses that represent a column address of the non-volatile memory device, where the start command is a read start command or a program start command.

20. The non-volatile memory device of claim 10, wherein the non-volatile memory device is a NAND flash memory device.

* * * * *